(12) United States Patent
Nakamura

(10) Patent No.: US 7,601,396 B2
(45) Date of Patent: Oct. 13, 2009

(54) COATING FILM FORMING METHOD

(75) Inventor: Akihiko Nakamura, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 642 days.

(21) Appl. No.: 11/404,968

(22) Filed: Apr. 14, 2006

(65) Prior Publication Data

US 2006/0240186 A1 Oct. 26, 2006

(30) Foreign Application Priority Data

Apr. 20, 2005 (JP) ............................... 2005-121788

(51) Int. Cl.
B05D 3/02 (2006.01)
(52) U.S. Cl. ....................................................... 427/379
(58) Field of Classification Search ................... 427/379

See application file for complete search history.

(56) References Cited

U.S. PATENT DOCUMENTS 6,489,252 B2 * 12/2002 Goo et al. .................... 438/758

FOREIGN PATENT DOCUMENTS

| JP | 10-310872 | 11/1998 |
| JP | 10-313002 | 11/1998 |

* cited by examiner

*Primary Examiner*—Roberts Culbert
(74) *Attorney, Agent, or Firm*—Carrier, Blackman & Associates, P.C.; Joseph P. Carrier; William D. Blackman

(57) ABSTRACT

The object of the present invention is to provide a method for forming a coating film in which a coating film is prevented from drastically shrinking by controlling the temperature accurately when a SOG film is formed in a substrate with a coating liquid containing an alkoxysilane compound, cracks are prevented from occurring in the SOG film by preventing the glass forming material from disappearing, and also metal materials of the circuit are prevented from melting and deforming. According to the present invention, the temperature of the surface of the material to be treated is escalated from a lower temperature to a higher temperature by setting at least three ranges of the temperature in the drying process, and the temperature of the surface of the material to be treated is further increased to 250-500° C. and maintained within the range of ±3° C. during the baking process.

10 Claims, 1 Drawing Sheet

COATING FILM FORMING METHOD

BACKGROUND OF THE INVENTION

1. Field of the Invention

The present invention relates to a method for forming a silicon oxide coating film on a surface of a semiconductor wafer, a glass substrate or the like by SOG (Spin On Glass)

2. Description of Prior Art

As a substrate circuit becomes precise, highly-integrated and multi-layered, there has been performed a method for forming an $SiO_2$ film on a surface of a substrate by SOG (Spin On Glass) for the purpose of insulation between layers and flattening. In order to manufacture a circuit, an interlayer insulating film (hereinafter referred to as "SOG film") made of $SiO_2$ is formed on a substrate by SOG or the like, a patterned resist mask is provided on the interlayer insulating film, and wiring gutters are formed by performing selective etching and removing the resist mask. After barrier metal is deposited, the wiring gutters are filled with a metal material for wiring such as Cu by electrolytic plating or the like so as to form the lower layer wiring. Next, after the barrier metal and the metal material are polished by CMP (chemical polishing), another SOG film is formed. In the same manner as mentioned above, the SOG film is etched selectively through the patterned resist mask, and via-holes and trench holes (gutters for upper layer wiring) are formed in the SOG film. After barrier metal is deposited on the walls of the via-holes and the gutters for the upper layer wiring, the via-holes and the gutters for the upper layer wiring are filled with a metal material for wiring such as Cu by electrolytic plating or the like so as to form the upper layer wiring.

A method for forming a SOG film has been disclosed, for example, in Patent Document 1. According to this method, a coating liquid made of a solution of an organic solvent containing an acid hydrolysate of trialkoxysilane is applied on a substrate and dried to form a coating film, a surface of the coating film is irradiated with UV in an oxidizing atmosphere, and the coating liquid is further applied. This operation is repeated once or more so as to obtain a desired film thickness. The coating film undergoes heat treatment at 350-500° C. in an inert atmosphere to form a silica-based film having a thickness of 2000 Å or more.

A similar method for forming a SOG film has been disclosed in Patent Document 2. According to this method, a wiring layer made of a material having a melting point of 500° C. or more is provided on a substrate, a coating liquid made of a solution of an organic solvent containing an acid hydrolysate of trialkoxysilane is applied on the wiring layer and dried, and then baking is performed at a temperature of 550-800° C. until no Si—H bond can be observed in the coating film. In this way, an $SiO_2$ coating film having high crack resistance is formed.

Patent document 1: Japanese Patent Application Publication No. 10-310872

Patent document 2: Japanese Patent Application Publication No. 10-313002

The above-mentioned coating liquid containing an alkoxysilane compound also contains an organic solvent. When it is heated, alcohol is generated while the alkoxysilane compound is hydrolyzed so as to form silanol, and water is generated while the silanol undergoes condensation so as to form mesh-like bonds of $SiO_2$. Accordingly, if appropriate drying aroma treatment and baking treatment are not performed, shrinkage of the SOG film occurs, which might cause cracks. Also, in a case where a glass forming material is added to improve crack resistance, when it is heated at a temperature of 500° C. or more, the glass material disappears.

In the technique disclosed in Patent Document 1, only a surface of the coating film is irradiated with UV, and thereby Si—H of trialkoxysilane in the surface of the coating film is converted into Si—OH. With this, it is possible to improve adhesion to another coating film to be formed next so as to prevent pin holes from being generated. However, in this technique, a UV radiation device needs to be installed in a spin coater.

The technique disclosed in Patent Document 2 requires a process for converting Si—H of trialkoxysilane into Si—OH by baking the $SiO_2$ coating film at a temperature of 500° C. or more, preferably 550-800° C. Consequently, the above-mentioned glass forming material cannot be added. There is also a drawback that patterns are destroyed by melting in the case where the material for the wiring layer is metal with a low melting point, such as aluminum.

The object of the present invention is to provide a method for forming a coating film in which the coating film is prevented from drastically shrinking by controlling the temperature accurately when a SOG film is formed in a substrate with a coating liquid containing an alkoxysilane compound, cracks are prevented from occurring in the SOG film by preventing the glass forming material from disappearing, and also metal material of a circuit is prevented from melting and deforming.

SUMMARY OF THE INVENTION

According to the present invention, there is provided a coating film forming method comprising the steps of applying a coating liquid for forming a SOG film on a material to be treated; and performing heat treatment so as to form a SOG film on the material to be treated, wherein the heat treatment includes at least a drying process and a subsequent baking process, the temperature of the surface of the material to be treated is escalated from a lower temperature to a higher temperature by setting at least three ranges of the temperature in the drying process, and the temperature of the surface of the material to be treated is further increased to 250-500° C. and maintained in the range of ±3° C. during the baking process.

In the case where three temperature ranges are applied to the material to be treated in the drying process, it is preferred that the first range is 50-100° C., the second range is 101-170° C., and the third range is 171-350° C. Also, the heating time in the drying process is preferably set to 1-3 minutes in each range.

The heating time in the baking process is preferably set to 10-60 minutes when the baking process is a batch-type treatment. However, the heating time can be reduced to 1-30 minutes when the baking process is a single-wafer-type treatment in which the material to be treated is baked one by one.

According to the method of the present invention, since drying is performed in at least three ranges of temperature during the drying process, it is possible to prevent a SOG film on the material to be treated from drastically shrinking. Since the surface temperature of the material to be treated is controlled in a small range during the baking process, it is possible to prevent the metal material of patterns on the material to be treated (circuit) from melting and deforming. Furthermore, it is possible to prevent a glass forming material for improving crack resistance from disappearing so as to form a SOG film having excellent crack resistance and stable quality.

DETAILED DESCRIPTION OF PREFERRED EMBODIMENTS

Figure 1:
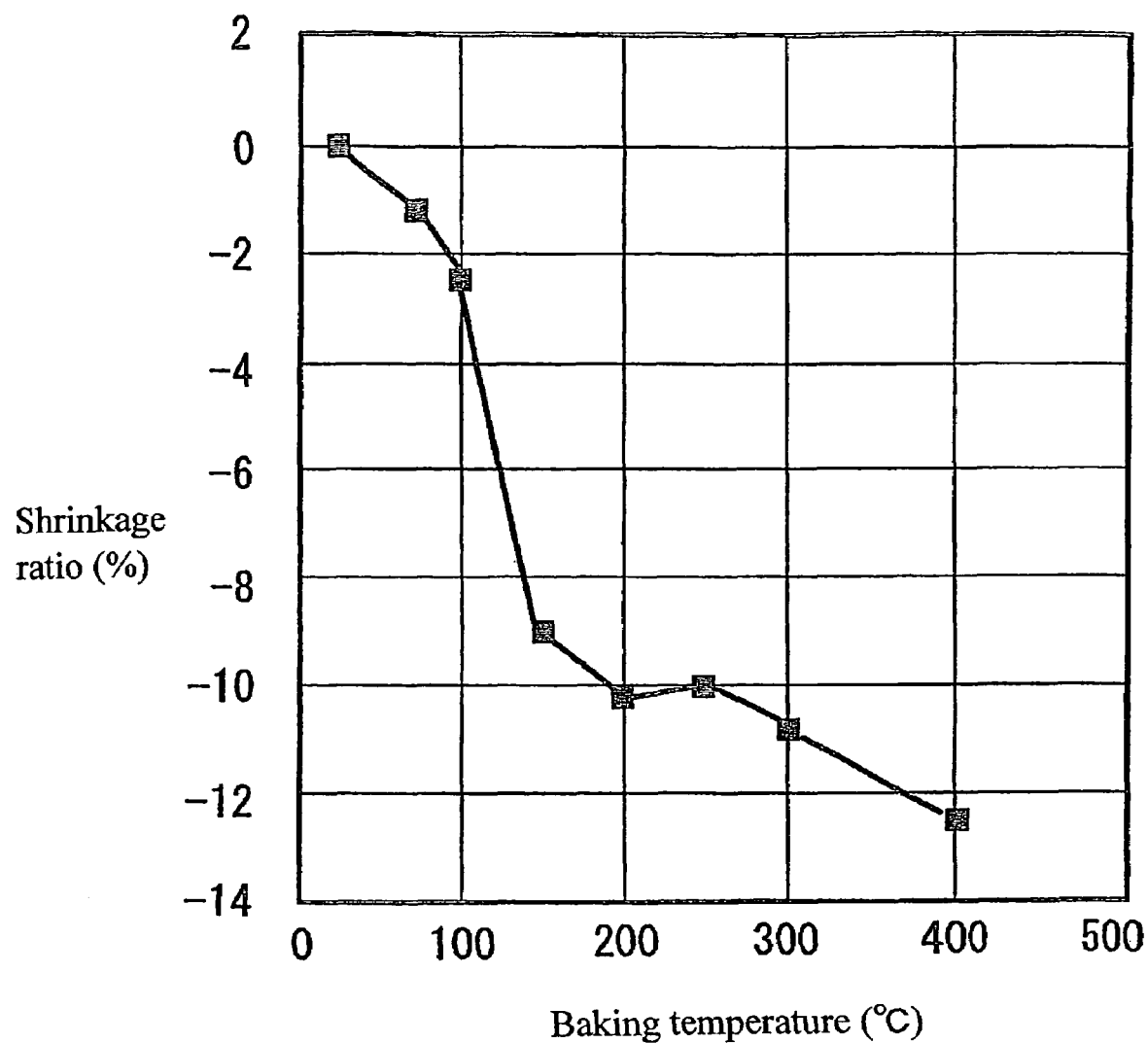
FIG. 1 is a graph showing an example of the relationship between the shrinkage ratio (%) of a SOG film and the temperature of the heat treatment.

A semiconductor substrate, a glass substrate, a metal plate, a ceramic substrate or the like is a material to be treated in the present invention, and a SOG film is formed on the material to be treated by a spinner method. In order to form a SOG film on a surface of the material to be treated, a coating liquid for forming a SOG film is applied onto the material to be treated, and then heating treatment is performed. The SOG film formed in this way preferably has a dielectric constant of equal to or less than 3.5. Examples of the coating liquid for forming such a SOG film include a coating liquid for forming an organic SOG film and a coating liquid for forming an inorganic SOG film as mentioned below.

In order to form a SOG film, a drying process and a baking process are performed. In the drying process, the material to be treated on which the above-mentioned coating liquid has been applied is inserted into a heat treatment device. There are no limitations on the methods of drying the material to be treated. However, for example, a plurality of materials to be treated are mounted in a hot plate. According to the present invention, at least three ranges of the surface temperature of the material to be treated are set in the drying process. When the three ranges are set, it is possible to provide a low-temperature plate, a middle-temperature plate, and a high-temperature plate. A material to be treated on which the above-mentioned coating liquid has been applied is mounted on the low-temperature plate first, transferred into the middle-temperature plate after a predetermined period of time, and finally dried on the high-temperature plate.

The above-mentioned drying process is for removing flammable materials such as an organic solvent. Therefore, it is preferred to perform this process in an atmosphere of nitrogen gas, and reduce the oxygen concentration of the atmosphere to 1% or less at the time of finishing the drying process.

In the case where three ranges of the surface temperature of the material to be treated are set in the drying process, it is preferable that the first range is 50-100° C., the second range is 101-170° C., and the third range is 171-350° C. It is preferred that the variation in the temperature of each range is small. However, the temperature is not required to be particularly accurate, and variations of around 4-6° C. are allowed. Also, it is preferred that the drying time is adjusted by taking into consideration the amount of the solvent within the coating liquid. However, the drying time can be set to be around 1-3 minutes in each range of the three temperature ranges.

The first temperature range is for removing methanol, ethanol or the like generated during the hydrolysis of alkoxysilane, or any solvents having a low boiling point contained in the coating liquid. The second temperature range is for completely removing the material having a low boiling point, and also removing any organic solvents having a relatively high boiling point such as alkylene glycol dialkyl ether. The third temperature range is for completely removing the above-mentioned organic solvents.

FIG. 1 is a graph showing an example of the relationship between the shrinkage ratio (%) of a SOG film and the temperature of the heat treatment. This graph shows that shrinkage of two points or more occurs in the case of heating at 100° C., and shrinkage of around 10 points occurs in the case of heating at 200° C. It is expected that the film quality will deteriorate when the SOG film is heated at around 150° C. or more from the beginning because the film drastically shrinks and easily cracks. Therefore, it is preferred that at least three ranges of the surface temperature of the material to be treated are set according to the present invention.

In the baking process subsequent to the drying process, the temperature of the surface of the material to be treated is further increased to 250-500° C., or more preferably 400-450° C., and baking is performed in this range. With this baking, it is possible to almost completely perform condensation and polymerization of silanol formed by hydrolyzing alkoxysilane, so as to obtain a mesh-like structure of Si—O—Si. It is also possible to remove water generated from the condensation reaction. In the baking process, it is important to keep the temperature of the surface of the material being treated substantially uniform, and it is necessary to keep the temperature in the range of ±3° C., preferably ±2° C.

The temperature of the surface of the material being treated needs to be controlled intentionally to be in the above-mentioned range. Otherwise, since the amount of water generated from the condensation reaction decreases at the last stage of the baking process, the surface temperature of the material to be treated increases drastically to exceed 500° C., which may cause the metal material of the circuit to melt. In addition, a SOG film is inherently susceptible to impact, and its crack resistance is only about 0.2 micron. Therefore, the crack resistance increases to about 1.5 micron by adding a glass forming material into a coating liquid. However, if the temperature of the surface of the material to be treated exceeds 500° C., the glass forming material disappears and the crack resistance deteriorates.

There are no limitations on the methods of treating the material in the baking process. For example, a plurality of materials to be treated can be mounted on a hot plate in the same manner as in the drying process. When this batch-type treatment is employed, it is preferred that the heating time is set to be in the range of 10-60 minutes. If the heating time is less than 10 minutes, there are cases where the density of the SOG film is insufficient because the baking is insufficient. If the heating time exceeds 60 minutes, it is a waste of time and energy. Single-wafer-type treatments in which the material to be treated is baked one by one are also preferred because a SOG film of high quality can be obtained. In this instance, the heating time can be reduced to 1-30 minutes.

An example of the coating liquid which can be used for the method of the present invention includes a coating liquid for forming organic SOG. The coating liquid for forming organic SOG preferably has a carbon content of 5 to 25 atomic weight % or, more preferably 8 to 20 atomic weight %. Incidentally, the carbon content refers to the ratio of the carbon atomic weight with respect to the total atomic weights of all chemical elements, which is theoretically calculated from the amount of reaction of the alkoxysilane compound which is contained in the coating liquid for forming organic SOG.

In order to obtain a coating film having the above-mentioned carbon content, it is preferable to use a coating liquid which contains at least one kind of alkoxysilane compound selected from alkoxysilane compounds expressed by the following equation (I), and can undergo hydrolysis and condensation within an organic solvent under an acid catalyst.

General equation:

$$R_n Si(OR^1)_{4-n} \qquad (I)$$

(where R refers to an alkyl group or an aryl group having a carbon number of 1-4, $R^1$ refers to an alkyl group having a carbon number of 1-4, and n refers to an integer of 1-2.)

Examples of the compound expressed by the above-mentioned general equation (I) include the following:

in the case of n=1: monoalkyl trialkoxysilane such as monomethyl trimethoxysilane, monomethyl triethoxysilane, monomethyl tripropoxysilane, monoethyl trimethoxysilane, monoethyl triethoxysilane, monoethyl tripropoxysilane, monopropyl trimethoxysilane, and monopropyl triethoxysilane; and monophenyl trialkoxysilane such as monophenyl trimethoxysilane and monophenyl triethoxysilane.

in the case of n=2: dialkyl dialkoxysilane such as dimethyl dimethoxysilane, dimethyl diethoxysilane, dimethyl dipropoxysilane, diethyl dimethoxysilane, diethyl diethoxysilane, diethyl dipropoxysilane, dipropyl dimethoxysilane, dipropyl diethoxysilane, and dipropyl dipropoxysilane; diphenyl dialkoxysilane such as diphenyl dimethoxysilane and diphenyl diethoxysilane; and alkylphenyl dialkoxysilane such as methyl phenyl dimethoxysilane and ethyl phenyl dimethoxysilane. Among these compounds, monomethyl trimethoxysilane and monomethyl triethoxysilane are preferred as (a) compound, and dimethyl dimethoxysilane and dimethyl diethoxysilane are preferred as (b) compound.

As other compounds which can undergo co-condensation with alkoxysilane compounds expressed by the above-mentioned general equation (I), (c) tetraalkoxysilane such as tetramethoxysilane, tetraethoxysilane, tetrapropoxysilane, and tetrabutoxysilane can be listed. Among these compounds, tetramethoxysilane and tetraethoxysilane are preferred.

These alkoxysilane compounds can be used alone, or two or more kinds can be used. Specifically, it is preferable to use a chemical compound which is obtained by combining (a) and (c) or (a), (b) and (c), or use (a) compound alone. Regarding the reaction mol ratio, when (a) and (c) are combined, it is preferable to use a coating liquid containing a hydrolytic co-condensation product which is obtained by reacting (a) monoalkyl trialkoxysilane of 2-6 mols, or, more preferably 2-4 mols with respect to (c) tetraalkoxysilane of 1 mol within an organic solvent under an acid catalyst because of its superior adhesion to the lower layer.

When (a), (b), and (c) are combined, it is preferable to use a coating liquid containing a hydrolytic co-condensation product which is obtained by reacting (c) tetraalkoxysilane of 0.5-4.0 mols, or, more preferably 1.0-3.0 mols and (a) monoalkyl trialkoxysilane 0.5-4.0 mols, or, more preferably 0.5-3.0 mols with respect to (b) dialkyl dialkoxysilane of 1 mol within an organic solvent under an acid catalyst because of its superior adhesion to the lower layer.

When (a) monoalkyl trialkoxysilane is used alone, a hydrolytic condensation product of a ladder type can easily be obtained. This ladder type is preferred because a SOG film of the lowest dielectric constant can be formed. The hydrolytic product may be a complete hydrolytic product or a partial hydrolytic product. The degree of hydrolysis can be adjusted by changing the amount of added water. The amount of added water can be adjusted depending on the characteristics of a SOG film to be formed. Generally speaking, it is preferable to react water of 1.0-10.0 times mol or more preferably 1.5-8.0 times mol with respect to the total amount of alkoxysilane compound of 1 mol expressed by the above-mentioned general equation. In a case of being less than this range, the degree of hydrolysis will be low, and film formation will be difficult. In a case of exceeding this range, gelation will easily occur, and storage stability will be deteriorated.

As the acid catalyst, it is possible to use either an organic acid or an inorganic acid commonly used in the conventional art. Examples of the organic acid include organic carboxylic acids such as acetic acid, propionic acid, or butyric acid. Examples of the inorganic acid include hydrochloric acid, nitric acid, sulfuric acid, or phosphoric acid. It is preferable to add the acid catalyst into the coating liquid such that the concentration of the acid in the coating liquid falls within 1-1,000 ppm, preferably 5-500 ppm, or to add a mixture of acid and water as an acid aqueous solution so as to cause hydrolysis of the alkoxysilane compound. Normally, the hydrolysis reaction completes in around 5-100 hours. The reaction is allowed to complete in a short period of time by dropping an aqueous solution of an acid catalyst into an organic solvent containing an alkoxysilane compound under a heating temperature which is from a room temperature to a temperature not exceeding 80° C. The alkoxysilane compound hydrolyzed in this manner causes a condensation reaction, and thereby forms a film.

For the organic solvent, conventional organic solvents can be used. Examples of the organic solvent include: monohydric alcohol such as methyl alcohol, ethyl alcohol, propyl alcohol, or butyl alcohol; polyhydric alcohol such as ethylene glycol, diethylene glycol, or propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate, or propylene glycol monoethyl ether acetate; and fatty acids such as an acetic acid or a propionic acid. These organic solvents can be used alone or two or more kinds can be combined. It is preferable to use the organic solvent of 10-30 times mol with respect to alkoxysilane of 1 mol.

The coating liquid for forming inorganic SOG comprises a solution in which alkylene glycol dialkyl ether containing an acid hydrolysis and condensation product of trialkoxysilane is used as the solvent, and a preferred one shows a weight increase when thermogravimetric analysis is conducted on the film-forming components after the solvent is removed because the dielectric constant is low and the crack resistance is excellent. The above-mentioned coating liquid for forming inorganic SOG can be obtained by dissolving trialkoxysilane into alkylene glycol dialkyl ether in a concentration of 1-5 mass % in terms of $SiO_2$ conversion, adding water of 2.5-3.0 mols per trialkoxysilane of 1 mol into this solution, causing hydrolytic condensation under an acid catalyst, and adjusting the amount of alcohol produced by the reaction in the mixture to be less than or equal to 15 mass %.

With the concentration of trialkoxysilane of 1-5 mass % in terms of $SiO_2$ conversion, it is possible to form a SOG film with a ladder structure. With the ladder structure, it is possible to form a dense film having a low dielectric constant.

Examples of the above-mentioned trialkoxysilane include trimethoxysilane, triethoxysilane, tripropoxysilane, tributoxysilane, diethoxy monomethoxysilane, monomethoxy dipropoxysilane, dibutoxy monomethoxysilane, ethoxymethoxy propoxysilane, monoethoxy dimethoxysilane, monoethoxy dipropoxysilane, butoxyethoxy propoxysilane, dimethoxy monopropoxysilane, diethoxy monopropoxysilane, and monobutoxy dimethoxysilane. Among these, trimethoxysilane, triethoxysilane, tripropoxysilane, and tributoxysilane are preferred. Further, trimethoxysilane and triethoxysilane are especially preferred.

Regarding the solvent, it is necessary to use alkylene glycol dialkyl ether so as to increase storage stability. With this, it is possible to control a decomposition reaction of an H—Si group of trialkoxysilane, or a reaction of substituting a hydroxy group of silanol as an intermediate product for an alkoxy group, which occurs in the conventional art of using lower alcohol as a solvent. Consequently, it is possible to prevent gelation.

Examples of the alkylene glycol dialkyl ether include dialkyl ether of alkylene glycol such as ethylene glycol dimethyl ether, ethylene glycol diethyl ether, ethylene glycol dipropyl ether, ethylene glycol dibutyl ether, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, or propylene glycol dibutyl ether. Among these, dialkyl ether of ethylene glycol or propylene glycol is preferred. Dimethyl ether is especially preferred. These organic solvents may be used alone or two or more kinds may be combined. These organic solvents can be used in 10-30 times mol with respect to alkoxysilane of 1 mol.

Preferably, water for performing hydrolysis of trialkoxysilane is in the range of 2.5-3.0 mols with respect to trialkoxysilane of 1 mol, more preferably in the range of 2.8-3.0 mols, so as to increase the degree of hydrolysis. In a case of being less than this range, although the storage stability is high, the degree of hydrolysis will be deteriorated, the amount of organic groups in the hydrolysate will be increased, and gas will be generated at the time of forming a film. In a case of exceeding this range, storage stability will be deteriorated.

Even if at least one kind selected among alkylene glycol dialkyl ether is used without using alcohol as a solvent, alcohol corresponding to the alkoxy group is inevitably generated in the course of hydrolysis of alkoxysilane. Therefore, it is necessary to remove the generated alcohol from the reaction system. Specifically, it is necessary to remove alcohol to less than or equal to 15 mass % of the coating liquid, more preferably to be less than or equal to 8 mass %. If the alcohol exceeds 15 mass %, the H—Si group and the generated alcohol react with each other, an RO—Si group is generated, and thereby the crack resistance deteriorates. In addition, gas is generated when the coating film is formed, also causing the above-mentioned trouble.

A preferred method for removing alcohol is distillation under reduced pressure for 2-6 hours at a temperature of 20-50° C. at a degree of vacuum of 30-300 mmHg, or more preferably, 50-200 mmHg. The coating liquid obtained in this manner is such that when thermogravimetric analysis is conducted on the film-forming components after the solvent is removed, an increase in the weight is obsereved, and it does not have a peak at 3,000 $cm^{-1}$ in the infrared absorption spectrum.

The above-described composition of the coating liquid for forming a SOG film can be used for the method according to the present invention. However, the coating liquid which can be used for the method according to the present invention is not limited to the above.

According to the method of the present invention, it is possible to obtain a substrate in which a SOG film of high quality is formed, and also save energy because the baking process is performed at a low temperature compared to the conventional technique. Therefore, the method is suitable for manufacturing semiconductor devices, liquid crystal devices, or the like for the IT field.

What is claimed is:

1. A coating film forming method comprising the steps of:
   applying a coating liquid for forming a SOG film on a material to be treated; and
   performing heat treatment so as to form a SOG film on the material to be treated,
   wherein the coating liquid includes a hydrolytic condensation product obtained using an organic solvent, an acid catalyst, and at least one type of alkoxysilane compound which undergoes hydrolysis and condensation within the organic solvent under the acid catalyst, and
   wherein the heat treatment includes at least a drying process and a subsequent baking process, the temperature of the surface of the material to be treated is escalated from a lower temperature to a higher temperature by setting at least three ranges of the temperature in the drying process, and the temperature of the surface of the material to be treated is further increased to 250-500° C. and once a desired temperature within the range is reached, such temperature is maintained within the range of ±3° C. during the baking process.

2. The coating film forming method according to claim 1, wherein three ranges are set as the temperature of the material to be treated in the drying process, and wherein the first range is 50-100° C., the second range is 101-170° C., and the third range is 171-350° C.

3. A coating film forming method according to claim 2, wherein the heating time in the drying process is set preferably to 1-3 minutes in each range.

4. The coating film forming method according to claim 1, wherein the heating time in the drying process is set preferably to 1-3 minutes in each range.

5. The coating film forming method according to claim 1, wherein the baking process is a batch-type treatment, and the heating time in the baking process is set to 10-60 minutes.

6. The coating film forming method according to claim 1, wherein the baking process is a single-wafer-type treatment in which the material to be treated is baked one by one, and the heating time in the baking process is set to 1-30 minutes.

7. A coating film forming method according to claim 1, wherein the heat treatment step consists of said drying process and said subsequent baking process.

8. A coating film forming method according to claim 1, wherein the coating liquid has a carbon content of 5-25 atomic weight %, a water content of 1.0-10 times mol with respect to 1 total mol of alkoxysilane compound(s), and a glass forming material.

9. A coating film forming method according to claim 8, wherein the method comprises a preliminary step of removing any alcohol from the coating liquid exceeding 15 mass % prior to said applying step.

10. A coating film forming method according to claim 1, wherein the hydrolytic condensation product is a ladder-type hydrolytic condensation product.

* * * * *

UNITED STATES PATENT AND TRADEMARK OFFICE
CERTIFICATE OF CORRECTION

PATENT NO.         : 7,601,396 B2                                                Page 1 of 1
APPLICATION NO.    : 11/404968
DATED              : October 13, 2009
INVENTOR(S)        : Nakamura It is certified that error appears in the above-identified patent and that said Letters Patent is hereby corrected as shown below:

Column 1:
    Lines 64 - 65, change "drying aroma treatment" to --drying treatment--.
    Line 67, change "glass forming material" to --glass-forming material--.

Column 2:
    Line 16, line 27, and line 67, change "glass forming material" to --glass-forming material--.

Column 4:
    Line 31, change "adding a glass" to --adding a glass- --.
    Line 34, change "glass forming material" to --glass-forming material--.
    Line 67, in equation (1), change "$RnSi(OR^1)_{4-n}$" to --$R_nSi(OR^1)_{4-n}$--.

Column 7:
    Line 48, change "obsereved" to --observed--.

Column 8:
    Line 3, change "the like for" to --the like, for--.
    Line 50, change "glass forming material" to --glass-forming material--.

Signed and Sealed this

Fourth Day of May, 2010

David J. Kappos
*Director of the United States Patent and Trademark Office*